United States Patent
Shimoda et al.

(10) Patent No.: US 9,293,325 B2
(45) Date of Patent: Mar. 22, 2016

(54) THIN FILM TRANSISTOR AND METHOD FOR FABRICATING THIN FILM TRANSISTOR

(71) Applicants: JAPAN SCIENCE AND TECHNOLOGY AGENCY, Saitama (JP); MITSUBISHI MATERIALS CORPORATION, Tokyo (JP); MITSUBISHI MATERIALS ELECTRONIC CHEMICALS CO., LTD., Akita (JP)

(72) Inventors: Tatsuya Shimoda, Ishikawa (JP); Hirokazu Tsukada, Akita (JP); Takaaki Miyasako, Mie (JP)

(73) Assignees: JAPAN SCIENCE AND TECHNOLOGY AGENCY, Saitama (JP); MITSUBISHI MATERIALS CORPORATION, Tokyo (JP); MITSUBISHI MATERIALS ELECTRONIC CHEMICALS CO., LTD., Akita (JP)

( * ) Notice: Subject to any disclaimer, the term of this patent is extended or adjusted under 35 U.S.C. 154(b) by 0 days.

(21) Appl. No.: 14/367,361

(22) PCT Filed: Dec. 20, 2012

(86) PCT No.: PCT/JP2012/083082
§ 371 (c)(1),
(2) Date: Jun. 20, 2014

(87) PCT Pub. No.: WO2013/094688
PCT Pub. Date: Jun. 27, 2013

(65) Prior Publication Data
US 2015/0001536 A1 Jan. 1, 2015

(30) Foreign Application Priority Data
Dec. 22, 2011 (JP) .................. 2011-281464

(51) Int. Cl.
*H01L 21/02* (2006.01)
*H01L 29/786* (2006.01)
(Continued)

(52) U.S. Cl.
CPC ...... *H01L 21/02565* (2013.01); *H01L 21/0262* (2013.01); *H01L 21/02183* (2013.01);
(Continued)

(58) Field of Classification Search
CPC ............. H01L 21/02565; H01L 21/0262; H01L 29/66969; H01L 29/4908; H01L 29/7869
USPC .......................................... 257/43
See application file for complete search history.

(56) References Cited

U.S. PATENT DOCUMENTS

| 2006/0079034 A1* | 4/2006 | Hoffman et al. ............. 438/151 |
| 2010/0210069 A1* | 8/2010 | Seon et al. ..................... 438/104 |
| 2013/0240871 A1 | 9/2013 | Shimoda et al. |

FOREIGN PATENT DOCUMENTS

| JP | 2006-121029 A | 5/2006 |
| JP | 2011-216845 A | 10/2011 |

(Continued)

OTHER PUBLICATIONS

International Search Report for PCT/JP2012/083082, Mar. 5, 2013.

*Primary Examiner* — Ermias Woldegeorgis

(57) ABSTRACT

An object of the present invention is to achieve improvement in performance of a thin film transistor including an oxide as a gate insulating layer, or simplification and energy saving in the processes of producing such a thin film transistor. A thin film transistor (100) of the present invention includes a first oxide layer (possibly containing inevitable impurities) (32) consisting of lanthanum (La) and tantalum (Ta), which has a surface (32a) formed after a precursor layer obtained from a precursor solution as a start material including a precursor containing lanthanum (La) and a precursor containing tantalum (Ta) as solutes is exposed to a hydrochloric acid vapor, between a gate electrode (20) and a channel (52). Moreover, in the thin film transistor, the surface (32a) of the first oxide layer (32) is in contact with the channel (52).

6 Claims, 12 Drawing Sheets

(51) Int. Cl.
*H01L 29/49* (2006.01)
*H01L 29/66* (2006.01)

(52) U.S. Cl.
CPC .... *H01L21/02192* (2013.01); *H01L 21/02282* (2013.01); *H01L 21/02323* (2013.01); *H01L 21/02337* (2013.01); *H01L 21/02614* (2013.01); *H01L 29/4908* (2013.01); *H01L 29/66969* (2013.01); *H01L 29/7869* (2013.01)

(56) References Cited

FOREIGN PATENT DOCUMENTS

| WO | 2007-010921 | A1 | 1/2007 |
| WO | 2011/078398 | A1 | 6/2011 |
| WO | 2011/138958 | A1 | 11/2011 |

* cited by examiner

THIN FILM TRANSISTOR AND METHOD FOR FABRICATING THIN FILM TRANSISTOR

TECHNICAL FIELD

The present invention relates to a thin film transistor and a method for fabricating a thin film transistor.

BACKGROUND ART

There has been conventionally disclosed a thin film transistor that includes a gate insulating layer containing a ferroelectric material (e.g. BLT ($Bi_{4-x}La_xTi_3O_{12}$) or PZT ($Pb(Zr_x, Ti_{1-x})O_3$)) in order to enable rapid switching at a low drive voltage. Meanwhile, in order to increase carrier density, there has been also disclosed a thin film transistor that includes a channel layer containing an oxide conductive material (e.g. indium tin oxide (ITO), zinc oxide (ZnO), or LSCO ($La_xSr_{1-x}CuO_4$)) (Patent Document 1).

In a method of producing the thin film transistor mentioned above, a gate electrode of laminated films made of Ti and Pt is formed in accordance with the electron-beam evaporation technique. The gate insulating layer consisting of BLT or PZT is formed on the gate electrode in accordance with the sol-gel method. The channel layer consisting of ITO is further formed on the gate insulating layer in accordance with the RF-sputtering technique. Subsequently Ti and Pt are formed on the channel layer in accordance with the electron-beam evaporation technique, thereby forming a source electrode and a drain electrode. An element region is then isolated from a different element region in accordance with the RIE method and the wet etching technique (a mixed solution of HF and HCl) (Patent Document 1).

PRIOR ART DOCUMENT

Patent Document

Patent Document 1: JP 2006-121029 A

SUMMARY OF THE INVENTION

Problems to be Solved by the Invention

There have been exemplified several conventional thin film transistors each including a gate insulating layer or a channel made of complex oxide. However, further development is still required so as to select a material achieving high properties as a thin film transistor and an appropriate production method therefor. Particularly, gate insulating films that have been widely adopted heretofore typically includes a process that takes relatively long time and/or requires expensive equipment, such as the vacuum process or a process in accordance with the photolithography method. These processes lead to quite low utilization ratios of raw materials and production energy. When adopting the above-mentioned production method, production of a thin film transistor requires many processes and takes long time, which is not preferred from the industrial and mass productivity perspectives. The conventional technique also causes the problem that increase in area is relatively difficult to achieve.

The present invention solves at least one of the problems mentioned above, to achieve improvement in performance of a thin film transistor including an oxide layer as a gate insulating layer, or simplification and energy saving in the processes of producing such a thin film transistor. The present invention thus contributes significantly to provision of a thin film transistor that is excellent from the industrial and mass productivity perspectives.

Solutions to the Problems

The inventors of this application have gone through close researches and analyses in order to select from a variety of oxides an oxide that appropriately exhibits a function as a gate insulating film. For example, even an oxide layer having a low leakage current, one of the important qualities as a gate insulating layer, may lack in suitability as the gate insulating layer because the so called electron mobility is low. Therefore, it is not easy to find an oxide having both a low current leakage and a high electron mobility when forming a transistor. Moreover, unless the oxide cannot be easily produced as compared with conventional oxides, the oxide is not attractive to the industries.

However, the inventors of this application have extensively conducted research and development for solving the problems described above, and resultantly found a new event. It is the finding that when a precursor of a specific oxide is subjected to a particular treatment, more specifically exposed to an acid vapor, the electron mobility thereof can be considerably increased even if the oxide is generally known to be a material having a low electron mobility. Further, the inventors of this application have also found that a thin film transistor including the oxide can function as a transistor, or exhibit a drain current ON/OFF ratio sufficient to function as a transistor. Moreover, it has also been found that the oxide can be easily produced as compared with conventional oxides. The present invention has been devised in view of the finding described above.

A thin film transistor of the present invention includes an oxide layer (possibly containing inevitable impurities) between a gate electrode and a channel wherein the oxide layer consists of lanthanum (La) and tantalum (Ta), and has a surface formed after a precursor layer obtained from a precursor solution as a start material including both a precursor containing lanthanum (La) and a precursor containing tantalum (Ta) as solutes is exposed to hydrochloric acid or a vapor thereof. Moreover, in this thin film transistor, the surface of the oxide layer is in contact with the channel.

According to this thin film transistor, by exposing a surface of a precursor of a predetermined oxide to an acid vapor as described above, an action considered as modification of the precursor including the surface of the precursor is applied, so that the function of an ultimate oxide layer as an insulating layer can be improved, although the mechanism thereof has not been clarified yet. Particularly, a thin film transistor including the above-described oxide layer can exhibit a low leakage current and also exhibit a considerable improvement in electron mobility considered as an electrical characteristic that is influenced by an interface between the oxide layer and a channel.

Another thin film transistor of the present invention includes an oxide layer (possibly containing inevitable impurities) between a gate electrode and a channel wherein the oxide layer consists of lanthanum (La) and tantalum (Ta), and has a surface formed after a precursor layer obtained from a precursor solution as a start material including both a precursor containing lanthanum (La) and a precursor containing tantalum (Ta) as solutes is exposed to a mixed vapor of a hydrochloric acid vapor and a nitric acid vapor. Moreover, in this thin film transistor, the surface of the oxide layer is in contact with the channel.

According to this thin film transistor, by exposing a surface of a precursor of a predetermined oxide to an acid vapor as described above, an action considered as modification of the precursor including the surface of the precursor is applied, so that the function of an ultimate oxide layer as an insulating layer can be improved, although the mechanism thereof has not been clarified yet. Particularly, a thin film transistor including the above-described oxide layer can exhibit a low leakage current and also exhibit a considerable improvement in electron mobility considered as an electrical characteristic that is influenced by an interface between the oxide layer and a channel.

Further, as another aspect of the thin film transistors described above, it is preferred that the channel is an indium oxide layer (possibly containing inevitable impurities). Accordingly, a high-performance thin film transistor having a gate insulating layer and a channel each formed of an oxide is obtained.

A method of producing a thin film transistor according to the present invention includes the following steps (1) and (2) between a gate electrode layer formation step and a channel formation step of forming a channel oxide (possibly containing inevitable impurities):
(1) an exposure step of exposing one surface of a first precursor layer, which is obtained from a first precursor solution as a start material including both a precursor containing lanthanum (La) and a precursor containing tantalum (Ta) as solutes, to hydrochloric acid or a vapor thereof; and
(2) a first oxide layer formation step of forming an oxide layer (possibly containing inevitable impurities) consisting of the lanthanum (La) and the tantalum (Ta) by heating the precursor layer in the atmosphere containing oxygen.

Further, there is no inhibition of performing, between the respective steps, any step not relevant to the purposes of the present invention, such as shifting or inspecting the substrate.

According to the method of producing a thin film transistor, the first oxide layer can be formed in accordance with a relatively simple process (e.g. ink jet method, screen printing method, intaglio/letterpress printing method or nanoimprint method) which does not use a photolithography method. Moreover, increase in area is easy to achieve. Thus, according to the method of producing a thin film transistor, there can be provided a method of a thin film transistor that is excellent from the industrial and mass productivity perspectives.

Another method of producing a thin film transistor according to the present invention includes the following steps (1) and (2) between a gate electrode layer formation step and a channel formation step of forming a channel oxide (possibly containing inevitable impurities):
(1) an exposure step of exposing to one surface of a first precursor layer, which is obtained from a first precursor solution as a start material including both a precursor containing lanthanum (La) and a precursor containing tantalum (Ta) as solutes, to a mixed vapor of a hydrochloric acid vapor and a nitric acid vapor; and
(2) a first oxide layer formation step of forming an oxide layer (possibly containing inevitable impurities) consisting of the lanthanum (La) and the tantalum (Ta) by heating the precursor layer in the atmosphere containing oxygen.

Further, there is no inhibition of performing, between the respective steps, any step not relevant to the purposes of the present invention, such as shifting or inspecting the substrate.

According to the method of producing a thin film transistor, the first oxide layer can be formed in accordance with a relatively simple process (e.g. ink jet method, screen printing method, intaglio/letterpress printing method or nanoimprint method) which does not use a photolithography method. Moreover, increase in area is easy to achieve. Thus, according to the method of producing a thin film transistor, there can be provided a method of a thin film transistor that is excellent from the industrial and mass productivity perspectives.

Further, as another aspect of the methods of producing a thin film transistor as described above, it is preferred that that the channel formation step is a step of forming an indium oxide layer (possibly containing inevitable impurities) by heating a second precursor layer obtained from a second precursor solution as a start material including both a precursor containing indium (In) as a solute in the atmosphere containing oxygen. Accordingly, a high-performance thin film transistor having a gate insulating layer and a channel each formed of an oxide is obtained.

In this application, the "imprinting" may be referred to as "nanoimprinting".

Effects of the Invention

A thin film transistor of the present invention can exhibit a low leakage current and also exhibit a considerable improvement in electron mobility considered as an electrical characteristic that is influenced by an interface between the oxide layer and a channel. According to a method of producing a thin film transistor according to the present invention, there can be provided a method of a thin film transistor that is excellent from the industrial and mass productivity perspectives because an oxide layer is formed in accordance with a relatively simple process.

EMBODIMENTS OF THE INVENTION

A thin film transistor 100 and a method of producing the same according to embodiments of the present invention are described in detail with reference to the accompanying drawings. The figure subsequent to FIG. 1H is denoted by 1J in order for easy distinction of letters. The thin film transistor according to the present embodiment has a so-called bottom gate structure, although the present embodiment is not limited to this structure. If a person skilled in the art having ordinary technical knowledge refers to the disclosure of the present embodiment, the person is capable of forming a top gate structure by changing the orders of the steps. The temperature indicated in this application shows a set temperature of a heater. Further, patterning of an extraction electrode from each electrode is not illustrated in order to simplify the drawings.

First Embodiment

FIGS. 1A to 1G are sectional schematic views each showing a process in the method of producing the thin film transistor 100 according to the present embodiment. The temperature indicated in this application shows a set temperature of a heater. Further, patterning of an extraction electrode from each electrode is not illustrated in order to simplify the drawings.

Steps of Producing Thin Film Transistor 100

(1) Formation of Gate Electrode

Figure 1A:
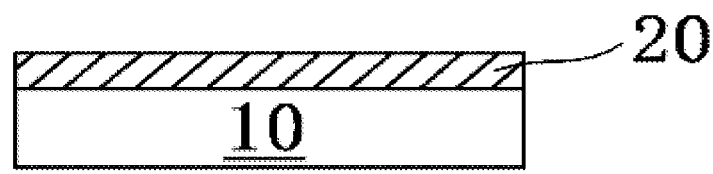
FIG. 1A is a sectional schematic view of a process in a method of producing a thin film transistor according to the first embodiment of the present invention.

A gate electrode 20 of the thin film transistor 100 according to the present embodiment is formed of a platinum (Pt) layer as shown in FIG. 1A. The platinum layer is formed on a $SiO_2/Si$ substrate (i.e. a substrate with a silicon oxide film formed on a silicon substrate; hereinafter, also simply referred to as the "substrate") 10 as a base material in accordance with the known sputtering technique. In the present embodiment, a $TiO_x$ film (not shown) having a thickness of about 10 nm is formed on $SiO_2$ for enhancing adhesion between the platinum layer and the $SiO_2/Si$ substrate as a base material.

In the present embodiment, a $SiO_2/Si$ substrate is adopted as the above-described substrate, but the base material in the present embodiment is not limited to high-heat-resistant glass. For example, it is possible to use various base materials including an insulating substrate other than high-heat-resistant glass (such as high-heat-resistant glass, an alumina ($Al_2O_3$) substrate, a STO (SrTiO) substrate, or an insulating substrate obtained by forming an STO (SrTiO) layer on a surface of a Si substrate with a $SiO_2$ layer and a Ti layer being interposed therebetween), or a semiconductor substrate (a Si substrate, a SiC substrate, a Ge substrate, or the like).

(2) Formation of First Precursor Layer

Figure 1B:
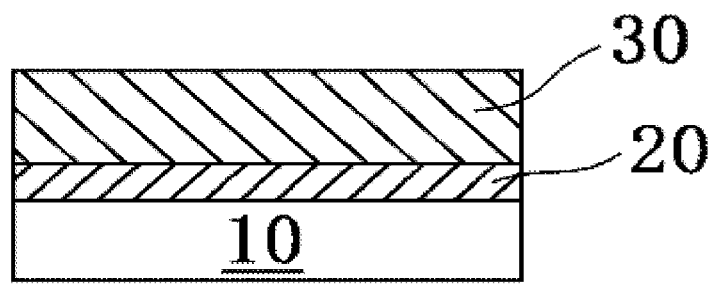
FIG. 1B is a sectional schematic view of a process in the method of producing the thin film transistor according to the first embodiment of the present invention.

Next, as shown in FIG. 1B, a first precursor layer 30 is formed on the gate electrode 20 in accordance with the known spin coating technique, the first precursor layer 30 being obtained from a precursor solution (also referred to as the first precursor solution) as a start material including both a precursor containing lanthanum (La) and a precursor containing tantalum (Ta) as solutes. The first precursor layer 30 is then heated to be preliminarily baked at 250° C. for about five minutes. The preliminary baking is performed in the oxygen atmosphere or in the atmosphere (hereinafter, also collectively referred to as the atmosphere containing oxygen). In the present embodiment, the formation of the first precursor layer 30 in accordance with the spin coating technique and the preliminary baking were performed total seven times for ultimately obtaining a sufficient thickness (e.g. about 160 nm) of the first oxide layer 32 as a gate insulating layer.

(3) Step of Exposure to Acid Vapor

Figure 1C:
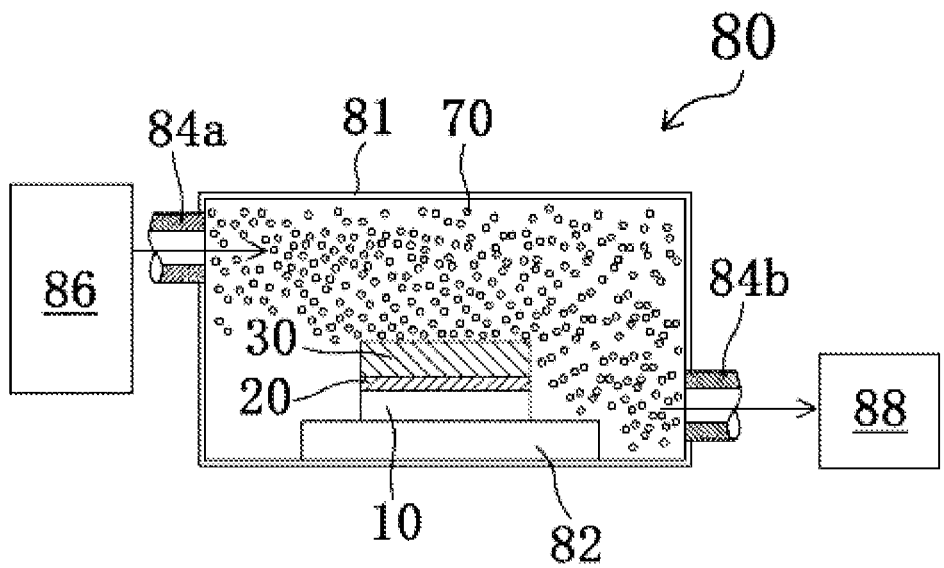
FIG. 1C is a sectional schematic view of a process in the method of producing the thin film transistor according to the first embodiment of the present invention.
Figure 1D:
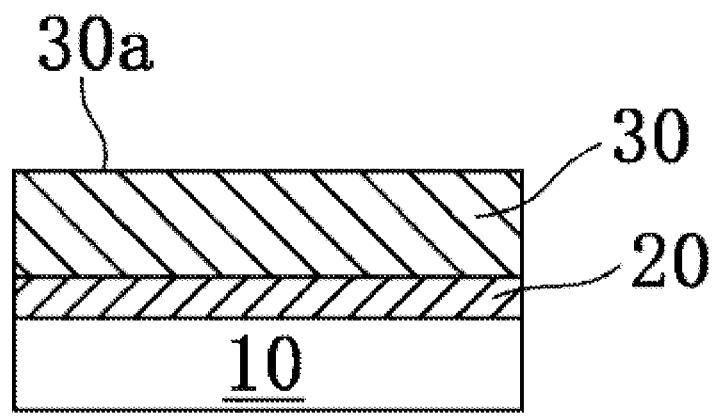
FIG. 1D is a sectional schematic view of a process in the method of producing the thin film transistor according to the first embodiment of the present invention.

Next, an exposure step of exposing a surface of the first precursor layer 30 formed on the gate electrode 20 to an acid vapor is performed. In the present embodiment, an acid vapor exposure device 80 is used as shown in FIG. 1C. Specifically, by a vapor supply device 86, a vapor 70 generated from an aqueous solution obtained by mixing nitric acid in an amount of less than 5% by mass with a 9 mass % aqueous hydrochloric acid solution is introduced into a chamber 81 by means of an inlet 84a using oxygen ($O_2$) as a carrier gas. In the chamber 81, a substrate 10 including the first precursor layer 30 formed on the gate electrode 20 is placed on a stage 82. A part of the vapor 70 of hydrochloric acid and nitric acid in the chamber 81 comes into contact with the surface of the first precursor layer 30. The vapor 70 of hydrochloric acid and nitric acid is fed to a known gas scrubber 88 (for acid) by way of an outlet 84b. The flow rate of the oxygen gas as a carrier gas at this time was 400 ml/min. For setting the temperature of the chamber, a rapid thermal anneal (RTA) device (not shown) capable of elevating the temperature from room temperature to 500° C. as the highest temperature in about 30 seconds was used. In the present embodiment, the highest temperature is attained in about 30 seconds using the RTA device, but it is also possible to set the upper limit to a temperature lower than the highest temperature. The time for exposure to the vapor 70 was about 30 seconds. By passing through the exposure step described above, the first precursor layer 30 is made to have a surface 30a exposed to the vapor 70 of hydrochloric acid and nitric acid as shown in FIG. 1D. The vapor 70 shown in FIG. 1C is denoted by circular marks for convenience of explanations, and is denoted in the same manner in other drawings.

The vapor 70 in the present embodiment is a vapor generated by boiling the aqueous solution of mixed hydrochloric acid and nitric acid. On the other hand, as another aspect of the present embodiment, it has been confirmed that certain electrical characteristics as a transistor can be improved even when the exposure step is performed using a vapor formed in a state of not heating the aqueous solution until it is boiled (typically a state of heating the aqueous solution to a temperature of not lower than 60° C. and lower than a boiling point), in other words in a state of not boiling the aqueous solution. However, the findings that have been so far obtained by the present inventors show that performing the above-described exposure step using a vapor formed by boiling the aqueous solution (typically a vapor obtained by heating the aqueous solution to a temperature of not lower than a boiling point and not higher than 500° C.) is a more preferred aspect from the viewpoint of improving electrical characteristics as a transistor.

(4) Baking of First Oxide Layer

Figure 1E:
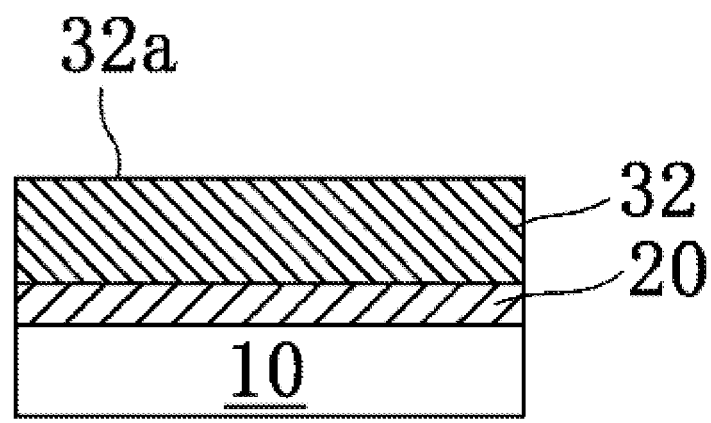
FIG. 1E is a sectional schematic view of a process in the method of producing the thin film transistor according to the first embodiment of the present invention.

The first precursor layer 30 is taken out from the chamber 81, and then heated at 550° C. for about 10 minutes to about 20 minutes to be mainly baked in the oxygen atmosphere (e.g. 100% by volume, although being not limited thereto; this applies to the "oxygen atmosphere" to be described later). As a result, the first oxide layer 32, which has a surface 32a exposed to the foregoing acid vapor and which consists of lanthanum (La) and tantalum (Ta) (possibly containing inevitable impurities; the same applies hereinafter), is formed on the gate electrode 20 as shown in FIG. 1E. The first oxide layer 32 consisting of lanthanum (La) and tantalum (Ta) is also called a LTO layer. In a different possible aspect, the main baking is performed in the chamber 81.

The precursor containing lanthanum (La) for the first oxide layer 32 in the present embodiment is, for example, lanthanum acetate. Other examples of the precursor that can be adopted include lanthanum nitrate, lanthanum chloride, and various lanthanum alkoxides (e.g. lanthanum isopropoxide, lanthanum butoxide, lanthanum ethoxide and lanthanum methoxyethoxide). The precursor containing tantalum (Ta) for the first oxide layer 32 in the present embodiment is, for example, tantalum butoxide. Other examples of the precursor that can be adopted include tantalum nitrate, tantalum chloride, and various tantalum alkoxides (e.g. tantalum isopropoxide, tantalum ethoxide and tantalum methoxyethoxide).

(5) Formation of Source Electrode and Drain Electrode

Figure 1F:
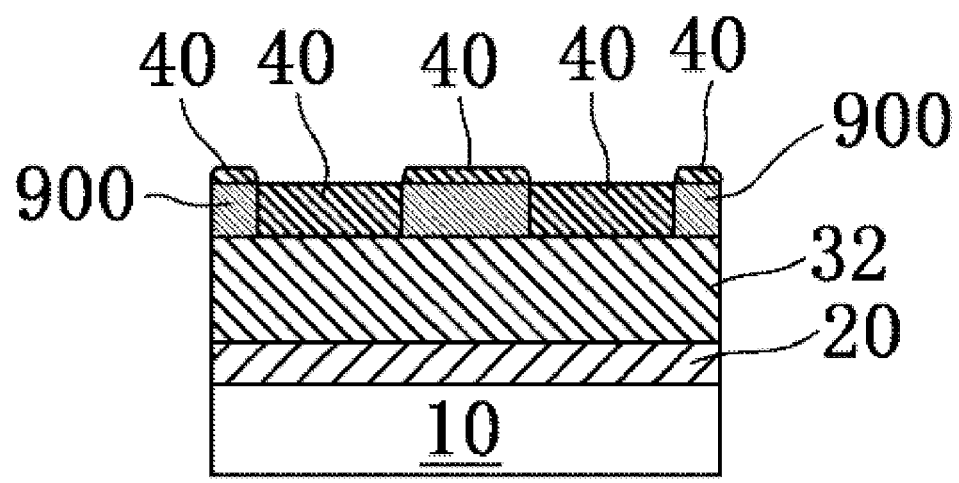
FIG. 1F is a sectional schematic view of a process in the method of producing the thin film transistor according to the first embodiment of the present invention.
Figure 1G:
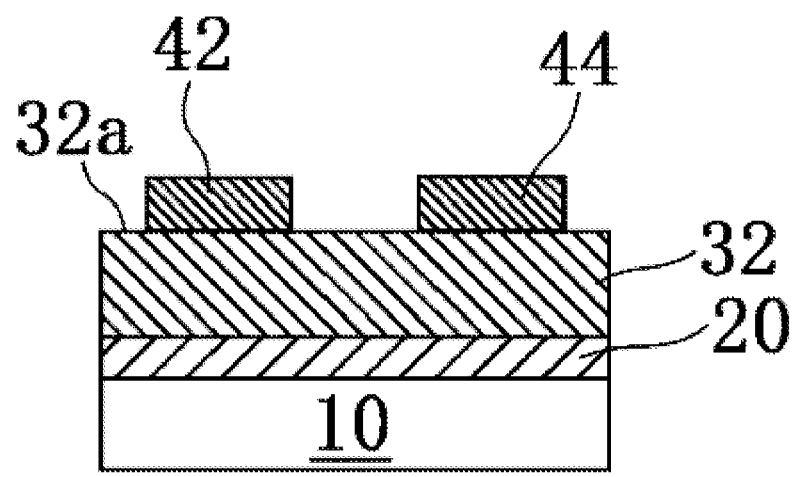
FIG. 1G is a sectional schematic view of a process in the method of producing the thin film transistor according to the first embodiment of the present invention.
Figure 1H:
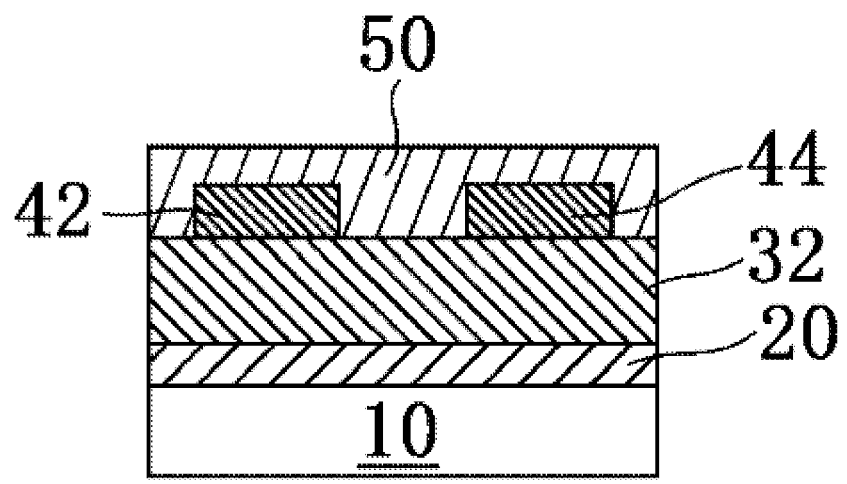
FIG. 1H is a sectional schematic view of a process in the method of producing the thin film transistor according to the first embodiment of the present invention.
Figure 1J:
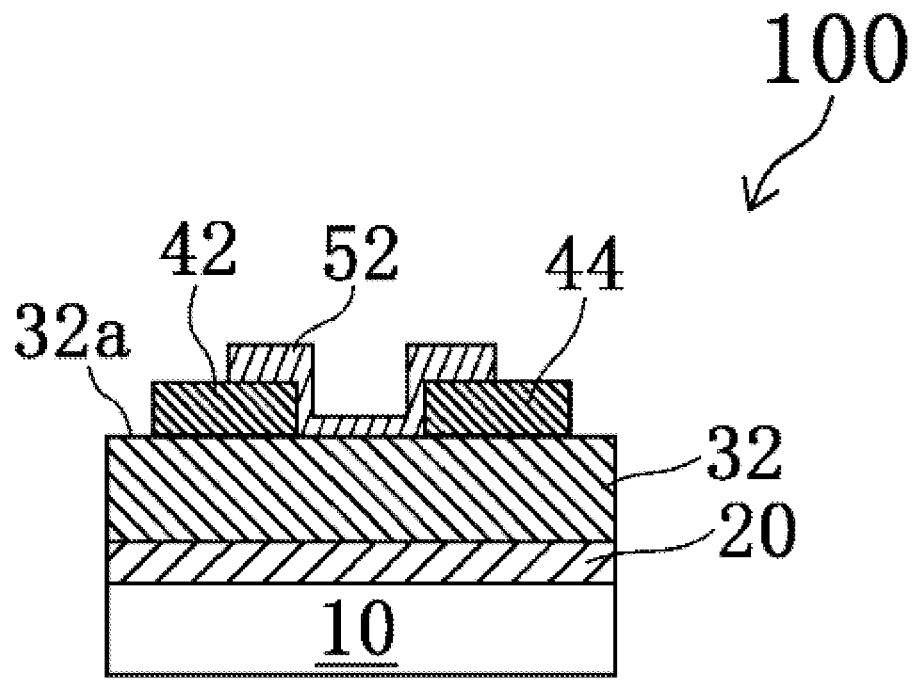
FIG. 1J is a sectional schematic view of a process in the method of producing the thin film transistor according to the first embodiment of the present invention.

Further, as shown in FIG. 1F, a resist film 900 patterned in accordance with the known photolithography method is then formed on the first oxide layer 32, and a platinum layer 40 is then formed on the first oxide layer 32 and the resist film 900 in accordance with the sputtering method. The resist film 900 is then removed, and a source electrode 42 and a drain electrode 44 each consisting of a platinum layer are formed on the first oxide layer 32 as shown in FIG. 1G. In the present embodiment, a heating treatment was then performed at 450° C. in the oxygen atmosphere.

(6) Formation of Channel

Then, as shown in FIG. 1H, a channel precursor layer (also referred to as the second precursor layer) 50 obtained from a channel precursor solution (also referred to as the second precursor solution) as a start material including both a precursor containing indium (In) as a solute is formed on the first oxide layer 32, the source electrode 42 and the drain electrode 44 in accordance with the known spin coating technique. The second precursor layer is then heated to be preliminarily baked at 300° C. for about five minutes. A patterning step is then performed in accordance with the known photolithography method and the known dry etching technique with argon (Ar) plasma. Further, the channel precursor layer 50 is heated to be mainly baked in the oxygen atmosphere for about 15 minutes so as to reach 450° C. There is thus formed an indium oxide layer (possibly containing inevitable impurities; the same applies hereinafter).

The indium oxide layer as a channel oxide layer 52 is formed so as to remain only on a part of the first oxide layer 32, the source electrode 42 and the drain electrode 44, and as a result of this, the thin film transistor 100 is produced. The channel oxide layer 52 according to the present embodiment was about 15 nm thick.

The precursor containing indium (In) for the channel oxide layer 52 in the present embodiment is, for example, indium acetylacetonate. Other examples of the precursor that can be adopted include indium nitrate, indium chloride, and various indium alkoxides (e.g. indium isopropoxide, indium butoxide, indium ethoxide and indium methoxyethoxide).

It should be especially noted that the gate insulating layer and the channel in the thin film transistor 100 of the present embodiment are each formed of a metal oxide as described above. Moreover, in the present embodiment, since the gate insulating layer and the channel are each formed by heating the various precursor solutions in the atmosphere containing oxygen, increase in area is easy to achieve, and industrial efficiency and mass productivity are considerably enhanced as compared with conventional methods.

Characteristics of Thin Film Transistor 100

Next, the present inventors examined current-voltage characteristics of the thin film transistor 100 produced in accordance with the production method described above.

Figure 2:
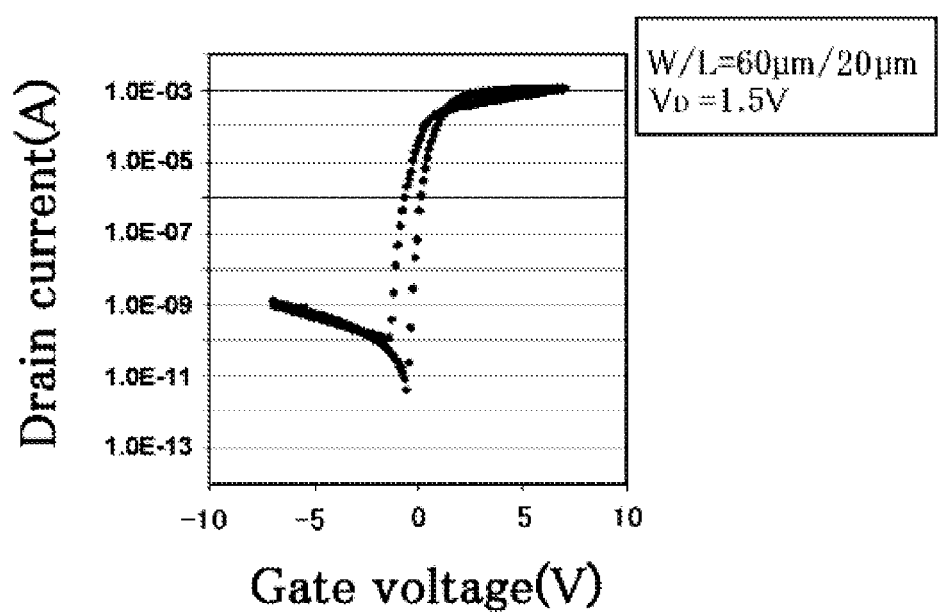
FIG. 2 is a graph of Vg-Id characteristics of the thin film transistor according to the first embodiment of the present invention.
Figure 3:
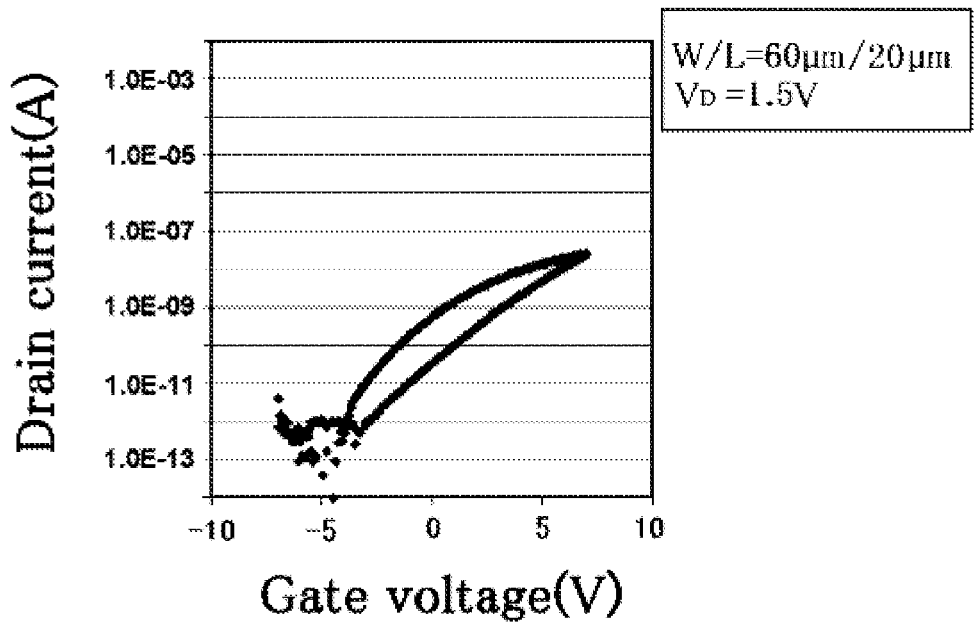
FIG. 3 is a graph of Vg-Id characteristics in Comparative Example (1).

FIG. 2 is a graph of Vg-Id characteristics of the thin film transistor 100. Table 1 shows the subthreshold characteristic (SS), the electron field-effect mobility ($\mu_{FE}$) and the ON-OFF ratio-related characteristic in the thin film transistor 100. As Comparative Example (1), a sample was prepared through the same steps as the above-described steps except that the step of exposure to an acid vapor was not performed. FIG. 3 is a graph of Vg-Id characteristics of the sample of Comparative Example (1).

TABLE 1

|  | SS (mV/dec.) | $\mu_{FE}$ (cm$^2$/Vs) | $\frac{ON}{OFF}$ |
|---|---|---|---|
| Characteristics of thin film transistor 100 | 92 | 600 | About 10$^8$ |
| Comparative Eaxample (1) | 1200 | 0.011 | About 10$^5$ |

As shown in FIGS. 2 and 3 and Table 1, it has been confirmed that the sample of Comparative Example (1) is hard to exhibit a function as a transistor, while the thin film transistor 100 according to the first embodiment can exhibit very good electrical characteristics as a transistor. Regarding the electrical characteristics of the thin film transistor 100, it is noteworthy that the ON/OFF ratio is approximately in an order of 10$^8$, and moreover the subthreshold characteristic (SS) is 92 (mV/dec.) and the electron field-effect is 600 (cm$^2$/Vs), an extremely high value. The fact that the foregoing values were obtained may be a result worthy of attention as a thin film transistor in which each of a gate insulating layer and a channel is formed of an oxide.

Second Embodiment

The present embodiment is similar to the first embodiment except that the step of exposure to an acid vapor (corresponding to FIG. 1C) is different from that in the first embodiment. Accordingly, the description duplicating with that of the first embodiment may not be repeatedly provided.

Figure 4:
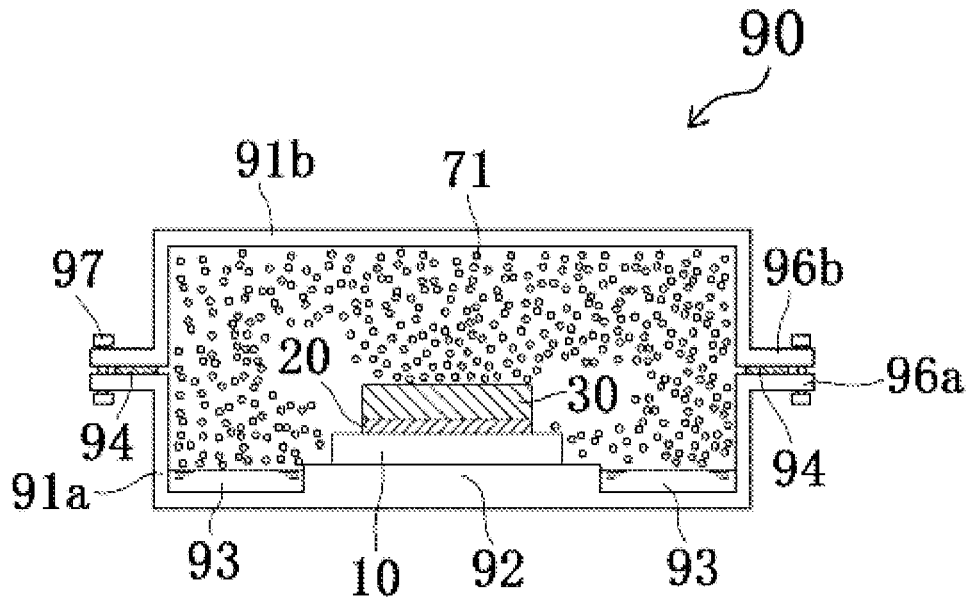
FIG. 4 is a sectional schematic view of a process in a method of producing a thin film transistor according to the second embodiment of the present invention.

The exposure step according to the present embodiment is performed in a closed chamber 90 formed by joining a storage portion 91a containing a 9 mass % aqueous hydrochloric acid solution 93 and a lid portion 91b with a known ring acid-resistant seal material 94 (e.g. seal material made of polytetrafluoroethylene (PTFE)) being interposed therebetween, and then airtightly integrating the storage portion 91a and the lid portion 91b by a bolt and nut 97 as shown in FIG. 4. In the closed chamber 90, a substrate 10 including a first precursor layer 30 formed on a gate electrode 20 is placed on a stage 92.

In the present embodiment, a vapor 71 is generated from the aqueous hydrochloric acid solution 93 heated to about 60° C. by a heater (not shown). A part of the vapor 71 comes into contact with a part or the whole of the surface of the first precursor layer 30 similarly to the first embodiment. The substrate 10 is taken out after the closed chamber 90 is sufficiently cooled. Then, the thin film transistor is produced similarly to the first embodiment. As a different comparative example (Comparative Example (2)), a thin film transistor was produced by adopting a step of directly adding dropwise the aqueous hydrochloric acid 93 to an indium oxide layer 52 after being mainly baked instead of performing the above-described exposure step.

Figure 5:
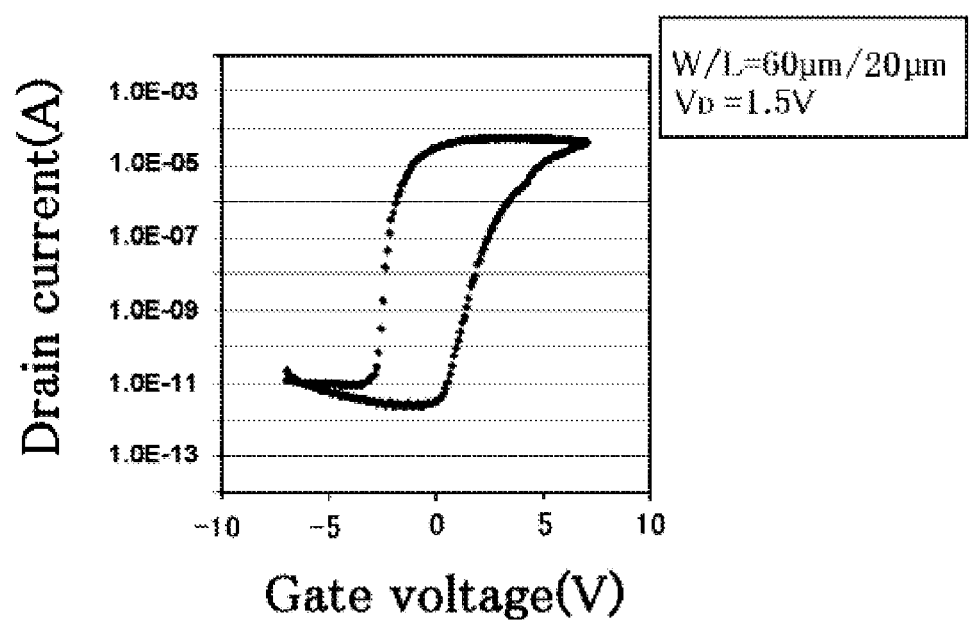
FIG. 5 is a graph of Vg-Id characteristics of the thin film transistor according to the first embodiment of the present invention.
Figure 6:
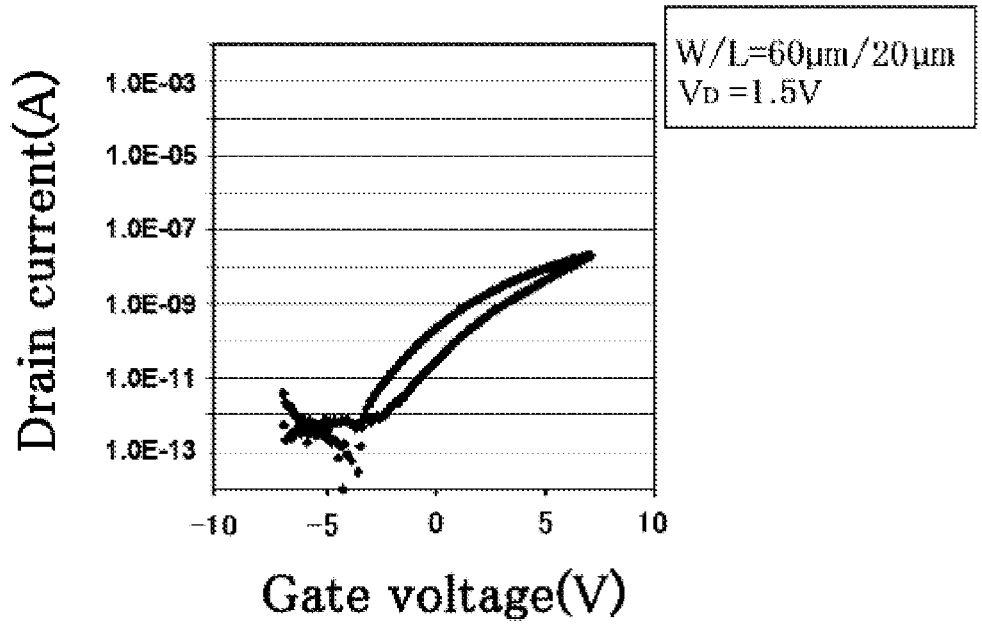
FIG. 6 is a graph of Vg-Id characteristics in Comparative Example (2).

FIG. 5 is a graph of Vg-Id characteristics of the thin film transistor according to the present embodiment. FIG. 6 is a graph of Vg-Id characteristics of the thin film transistor of Comparative Example (2).

As shown in FIG. 5, it has been confirmed that the ON/OFF function, one of the important functions as a transistor, is exhibited although the so called hysteresis exists in increase/decrease in drain current associated with application of a voltage to the gate electrode. Accordingly, comparison with Comparative example (1) shown in FIG. 3 and Comparative Example (2) shown in FIG. 6 in which the transistor was formed without passing through the above-described exposure step has shown that certain electrical characteristics as a transistor can be improved.

It has been confirmed that electrical characteristics as a transistor can be improved even when the exposure step is performed using a vapor formed in a state of not boiling the aqueous solution similarly to the vapor adopted in the present invention. However, the findings that have been so far obtained by the present inventors shown that performing the above-described exposure step using a vapor formed by boiling the solution (typically a vapor obtained by heating the solution to a temperature of not lower than a boiling point and not higher than 500° C.) as in the first embodiment is a more preferred aspect from the viewpoint of improving electrical characteristics as a transistor.

Third Embodiment

The present embodiment is similar to the first embodiment except that imprinting is performed in the process of forming some layers in the first embodiment. Accordingly, the description duplicating with that of the first embodiment may not be repeatedly provided.

Steps of Producing Thin Film Transistor 200

FIGS. 7A to 7J are sectional schematic views each showing a process in the method of producing the thin film transistor 200 according to the present embodiment. Further, patterning of an extraction electrode from each electrode is not illustrated in order to simplify the drawings.

(1) Formation of Gate Electrode

Figure 7A:
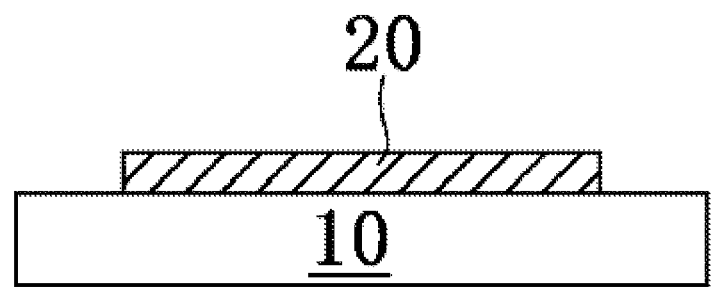
FIG. 7A is a sectional schematic view of a process in a method of producing a thin film transistor according to the third embodiment of the present invention.

In the present embodiment, as shown in FIG. 7A, first a platinum (Pt) layer as a gate electrode 20 is formed on a substrate 10 similarly to the first embodiment. In the present embodiment, a $TiO_x$ film (not shown) having a thickness of about 10 nm is formed on $SiO_2$ for enhancing adhesion between the platinum layer and the substrate 10.

(2) Formation of First Precursor Layer

Figure 7B:
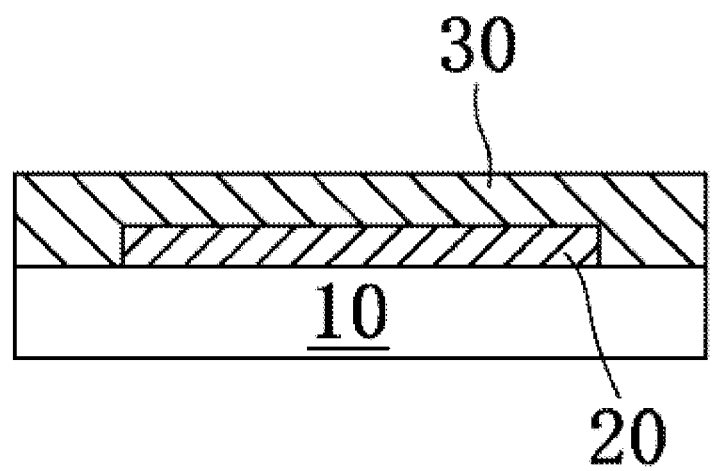
FIG. 7B is a sectional schematic view of a process in a method of producing a thin film transistor according to the third embodiment of the present invention.
Figure 7C:
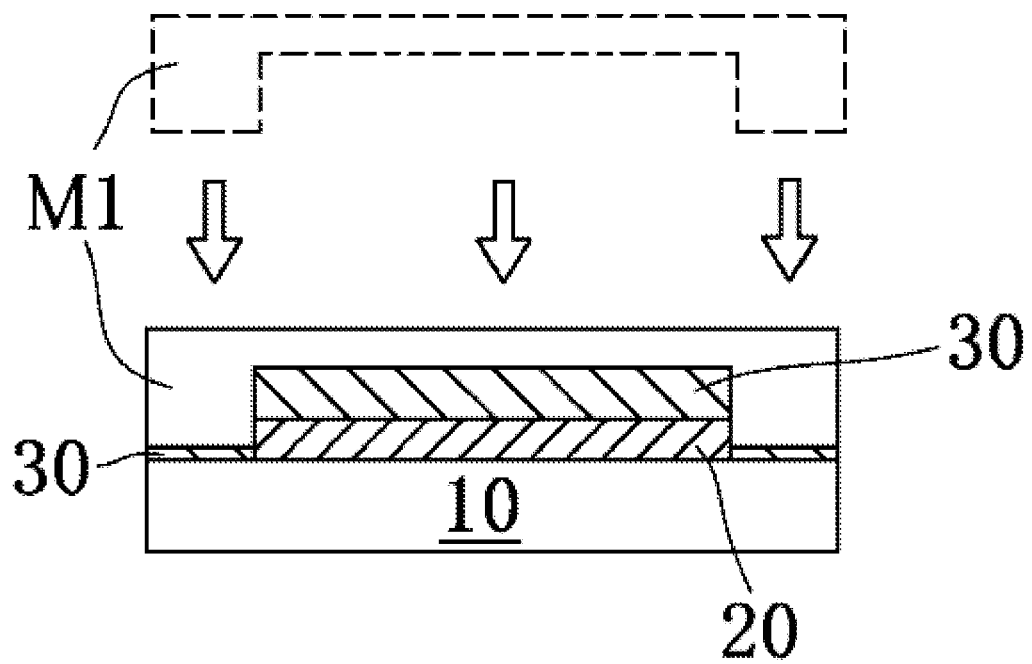
FIG. 7C is a sectional schematic view of a process in a method of producing a thin film transistor according to the third embodiment of the present invention.

As shown in FIG. 7B, a first precursor layer 30 obtained from a first precursor solution as a start material is formed on the gate electrode 20 similarly to the first embodiment. The first precursor layer 30 is then heated to be preliminarily baked at 150° C. for about five minutes similarly to the first embodiment. In the present embodiment, the formation of the first precursor layer 30 in accordance with the spin coating technique and the preliminary baking were performed for ultimately obtaining a sufficient thickness (e.g. about 160 nm) of a first oxide layer 32 as a gate insulating layer. The preliminary baking can sufficiently evaporate a solvent in the first precursor layer 30 and can cause a preferred gel state for exerting properties that enable future plastic deformation (possibly a state where organic chains remain before thermal decomposition). As shown in FIG. 7C, the imprinting is then performed with heating to 180° C. using a first precursor layer mold M1 with the pressure of 10 MPa so as to pattern the first precursor layer 30. As a result, the first precursor layer mold M1 according to the present embodiment forms the first precursor layer 30 that includes a thicker layer portion of about 100 nm to 300 nm thick and a thinner layer portion of about 10 nm to about 100 nm thick as shown in FIG. 7C.

The first precursor layer 30 is then entirely etched so that the first precursor layer 30 is removed in the regions other than a region of the first precursor layer 30 to be left with imprinting (step of etching the entire surface of first precursor layer 30). The etching step according to the present embodiment is executed in accordance with the wet etching technique without including the vacuum process. The etching can be possibly performed using plasma, in other words, in accordance with the dry etching technique. It is alternatively possible to use the known technique of performing the plasma process at the atmospheric pressure.

(3) Step of Exposure to Acid Vapor

Figure 7D:
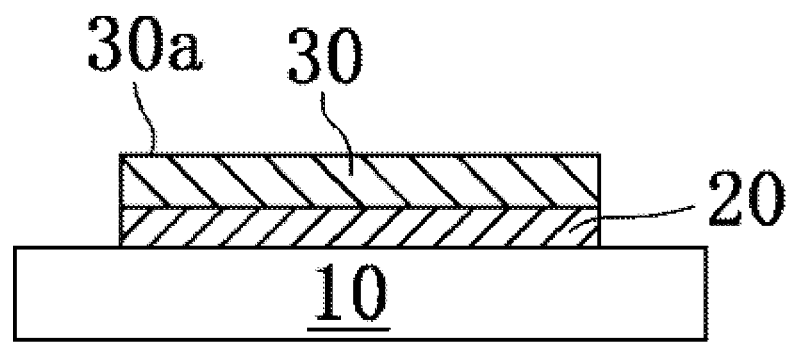
FIG. 7D is a sectional schematic view of a process in a method of producing a thin film transistor according to the third embodiment of the present invention.

Next, an exposure step of exposing a surface of the patterned first precursor layer 30 to a vapor is performed. In the present embodiment, similarly to the first embodiment, an acid vapor exposure device 80 is used as shown in FIG. 1C. As a result, a part of the vapor 70 of hydrochloric acid and nitric acid in the chamber 81 comes into contact with the surface of the first precursor layer 30. By passing through the foregoing exposure step, the first precursor layer 30 is made to have a surface 30a exposed to the vapor 70 of hydrochloric acid and nitric acid as shown in FIG. 7D.

(4) Baking of First Oxide Layer

Figure 7E:
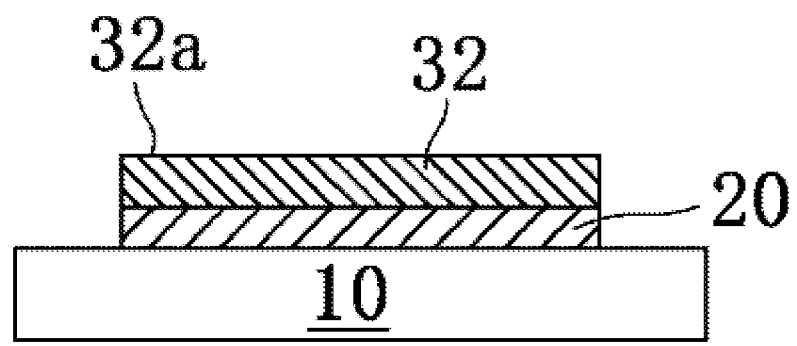
FIG. 7E is a sectional schematic view of a process in a method of producing a thin film transistor according to the third embodiment of the present invention.

The first precursor layer 30 is taken out from the chamber 81, and then heated at 550° C. for about 10 minutes to about 20 minutes to be mainly baked in the oxygen atmosphere. As a result, the first oxide layer 32 is formed on the gate electrode 20 as shown in FIG. 7E, the first oxide layer 32 having a surface 32a exposed to the foregoing acid vapor and which consists of lanthanum (La) and tantalum (Ta).

Figure 7F:
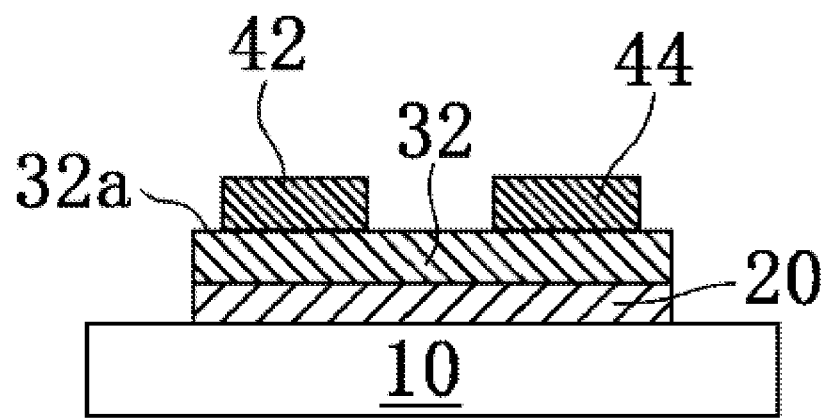
FIG. 7F is a sectional schematic view of a process in a method of producing a thin film transistor according to the third embodiment of the present invention.

Further, as shown in FIG. 7F, a source electrode 42 and a drain electrode 44 each consisting of a platinum layer are formed on the first oxide layer 32 similarly to the first embodiment. In the present embodiment, a heating treatment was then performed at 450° C. in the oxygen atmosphere.

(6) Formation of Channel

Figure 7G:
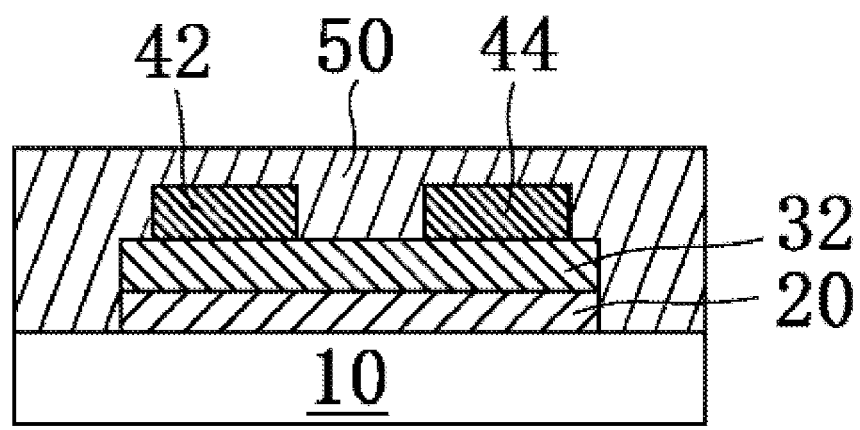
FIG. 7G is a sectional schematic view of a process in a method of producing a thin film transistor according to the third embodiment of the present invention.

Then, as shown in FIG. 7G, a channel precursor layer 50 as a second precursor layer obtained from a second precursor solution as a start material is formed on the substrate 10, the first oxide layer 32, the source electrode 42 and the drain electrode 44. The second precursor layer is then heated to be preliminarily baked at 150° C. for about five minutes.

Figure 7H:
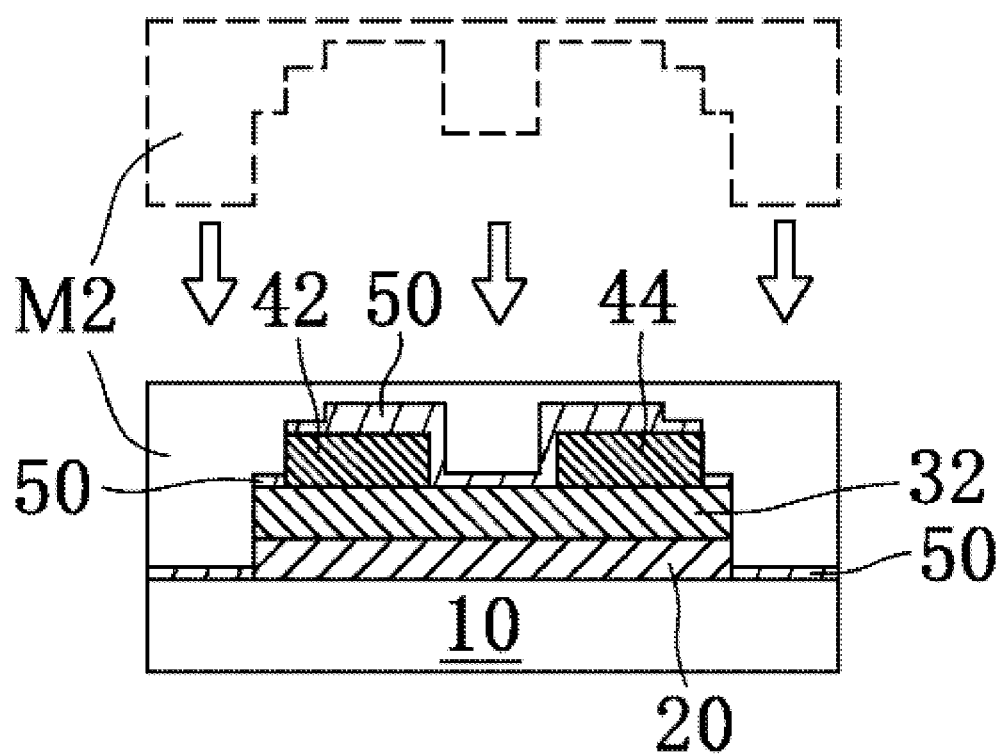
FIG. 7H is a sectional schematic view of a process in a method of producing a thin film transistor according to the third embodiment of the present invention.

Subsequently, as shown in FIG. 7H, the imprinting is then performed with heating to 200° C. using a second precursor layer mold M2 with the pressure of 8 MPa so as to pattern the channel precursor layer 50 similarly to formation of the first precursor layer. As a result, the channel precursor layer 50 that includes a thicker layer portion of about 100 nm to 300 nm thick and a thinner layer portion of about 10 nm to about 100 nm thick is formed as shown in FIG. 7H.

The channel precursor layer 50 is then entirely etched so that the channel precursor layer 50 is removed in the regions other than a region of the channel precursor layer 50 to be left with imprinting (step of etching the entire surface of channel precursor layer 50). In the etching step according to the present embodiment, the etching can be possibly performed in accordance with the so called dry etching technique using plasma as well as the wet etching technique. It is alternatively possible to use the known technique of performing the plasma process at the atmospheric pressure.

Figure 7J:
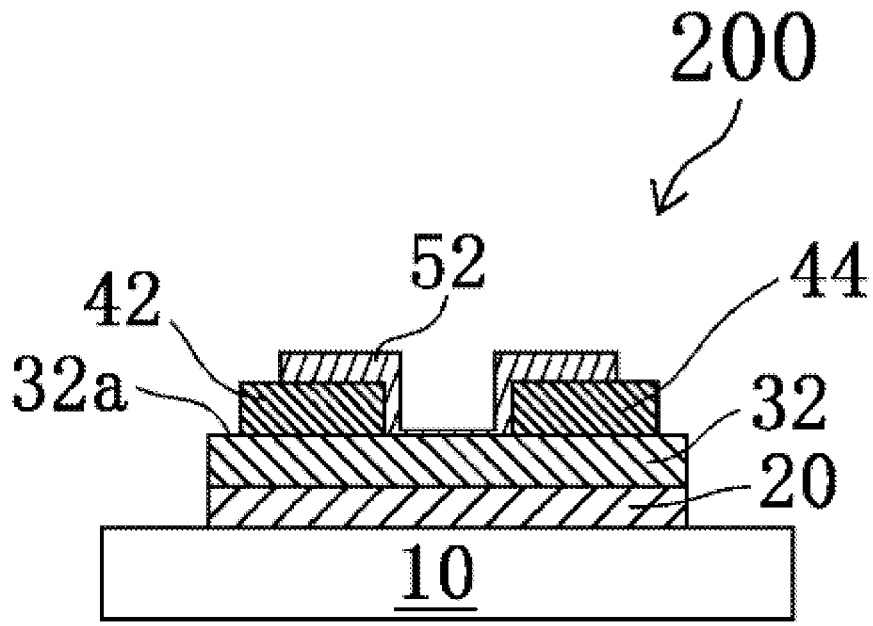
FIG. 7J is a sectional schematic view of a process in a method of producing a thin film transistor according to the third embodiment of the present invention.

The channel precursor layer 50 is heated to be mainly baked in the oxygen atmosphere for about 15 minutes so as to reach 450° C. There is thus formed an indium oxide layer (possibly containing inevitable impurities; the same applies hereinafter) 52 as shown in FIG. 7J. As a result, the thin film transistor 200 is produced.

As described above, the gate insulating layer and the channel in the thin film transistor 200 of the present embodiment are each formed of a metal oxide and formed by imprinting. Accordingly, increase in area is easy to achieve, and industrial efficiency and mass productivity are considerably enhanced as compared with conventional methods. Moreover, the thin film transistor 200 according to the present embodiment has electrical characteristics comparable to those of the thin film transistor 100.

OTHER EMBODIMENTS

In the embodiments described above, the exposure step of exposing the surface of the first precursor layer 30 to an acid vapor has been described, but a step of performing the exposure by adding the aqueous hydrochloric acid solution 93 dropwise to the surface of the first precursor layer 30 can be adopted as another possible aspect.

Figure 8:
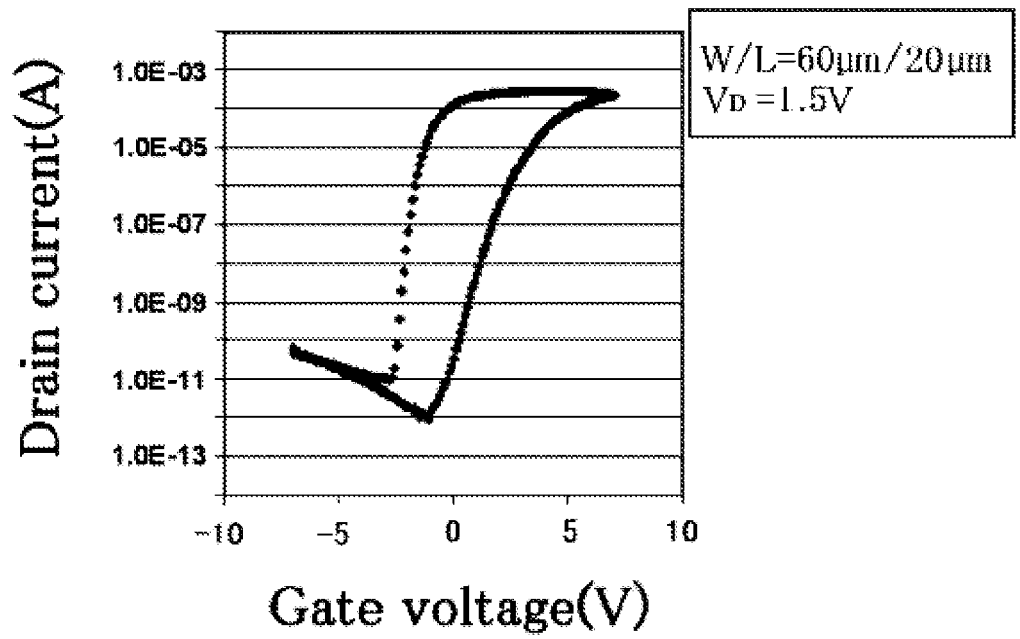
FIG. 8 is a graph of Vg-Id characteristics of thin film transistors according to other embodiments.

For example, similarly to the first embodiment, a 0.01 mass % aqueous hydrochloric acid solution is added dropwise so as to spread over the entire surface of the first precursor layer 30 having been preliminarily baked at 250° C., and aqueous hydrochloric acid on the surface is then splashed and removed using the known spin coater. FIG. 8 is a graph of Vg-Id characteristics of a thin film transistor produced in accordance with a process similar to the production process according to the first embodiment except for the aforementioned step. It could be confirmed that a thin film transistor including an oxide layer formed in accordance with the aforementioned production method can function as a transistor, or exhibit a drain current ON/OFF ratio sufficient to function as a transistor as shown in FIG. 8. Accordingly, even when liquid hydrochloric acid is used instead of a vapor, an action considered as modification of the precursor including the surface of the precursor of the oxide film is applied, so that the function of an ultimate oxide layer as an insulating layer can be improved.

In order to properly exhibit effects according to the embodiments described above, the solvent of the first precursor solution is preferably one or two alcohol solvent selected from the group consisting of ethanol, propanol, butanol, 2-methoxyethanol, 2-ethoxyethanol and 2-butoxyethanol, or one or two carboxylic acid solvent selected from the group consisting of acetic acid, propionic acid and octylic acid. The solvent of the channel precursor solution (second precursor solution) is preferably one or two alcohol solvent selected from the group consisting of ethanol, propanol, butanol, 2-methoxyethanol, 2-ethoxyethanol and 2-butoxyethanol, or one or two carboxylic acid selected solvent from the group consisting of acetic acid, propionic acid and octylic acid.

The preliminary baking temperature in preliminary baling for forming the oxide layers in the embodiments described above is preferably not lower than 100° C. and not higher than 250° C. Thus, the solvent in various precursor layers can be reliably evaporated. Particularly when the imprinting step is subsequently performed, the preliminary baking in the aforementioned temperature range can cause a preferred gel state for exerting properties that enable future plastic deformation (possibly a state where organic chains remain before thermal decomposition).

As another preferred embodiment, imprinting is performed using a mold (typically first precursor layer mold M1 and second precursor layer M2) heated to a temperature of not lower than 80° C. and not higher than 300° C. beforehand in the imprinting step according to the third embodiment.

By performing the imprinting step using the mold heated in the above-described temperature range (not lower than 80° C. and not higher than 300° C.), deterioration of the plastic deformability of the precursor layer can be reliably prevented during the imprinting, so that the desired imprinted structure can be formed with higher accuracy.

The heating temperature of the mold is set in the range from 80° C. to 300° C. for the following reasons. Firstly, if the heating temperature of the mold during the imprinting is less than 80° C., the residual solvent in each precursor layer reduces the practicability of molding during molding of the imprinted structure or the reliability or stability after molding. In addition, if the heating temperature during imprinting exceeds 300° C., the decomposition (oxidative thermal decomposition) organic chain, a source of plastic deformability, proceeds to deteriorate plastic deformability. In view of these, the imprinting is more preferably performed using a mold heated to a temperature of not lower than 100° C. and not higher than 250° C. for the heating temperature of the mold.

In the above-described imprinting step, preferably the mold separation process is preliminarily performed on the surface of each of the precursor layers to be in contact with an imprinting surface and/or on the imprinting surface of the mold, and each of the precursor layers are imprinted thereafter. Such a process achieves decrease in frictional force between each of the precursor layers and the mold, so that each of the precursor layers can be imprinted more accurately. Examples of a mold separation agent usable in the mold separation process include surface active agents (e.g. a fluorochemical surface active agent, a silicone surface active agent, and a non-ionic surface active agent), and diamond-like carbon containing fluorine.

As described above, the above embodiments have been disclosed not for limiting the present invention but for describing these embodiments. Furthermore, modification examples made within the scope of the present invention, inclusive of other combinations of the embodiments, will be also included in the scope of the patent claims.

DESCRIPTION OF REFERENCE SIGNS 10 substrate
20 gate electrode
30 first precursor layer
30a surface of first precursor layer
32 first oxide layer
32a surface of first oxide layer
40 platinum layer
42 source electrode
44 drain electrode
50 channel precursor layer (second precursor layer)
52 channel oxide layer
70, 71 vapor
80 acid vapor exposure device
81 chamber
82 stage
84a inlet
84b outlet
86 vapor supply device
88 scrubber
90 closed chamber
91a storage portion
91b lid portion
93 aqueous hydrochloric acid solution
94 acid-resistant seal material
97 nut
100, 200, thin film transistor
900 resist film
M1 first precursor layer mold
M2 second precursor layer mold

The invention claimed is:

1. A method of producing a thin film transistor comprising the following steps between a gate electrode layer formation step and a channel formation step of forming a channel oxide (possibly containing inevitable impurities):
    an exposure step of exposing one surface of a first precursor layer, which is obtained from a first precursor solution as a start material including both a precursor containing lanthanum (La) and a precursor containing tantalum (Ta) as solutes, is exposed to hydrochloric acid or a vapor thereof and;
    a first oxide layer formation step of forming an oxide layer (possibly containing inevitable impurities) consisting of the lanthanum (La) and the tantalum (Ta) by heating the precursor layer in the atmosphere containing oxygen.

2. The method of producing a thin film transistor according to claim 1, wherein the hydrochloric acid vapor is a vapor generated by boiling the hydrochloric acid.

3. The method of producing a thin film transistor according to claim 1, wherein the exposure step is performed while the hydrochloric acid, the vapor of the hydrochloric acid or the mixed vapor is heated to a temperature of not lower than 60° C. and not higher than 500° C.

4. The method of producing a thin film transistor according to claim 1, wherein the channel formation step is a step of forming an indium oxide layer (possibly containing inevitable impurities) by heating a second precursor layer obtained from a second precursor solution as a start material including both a precursor containing indium (In) as a solute in the atmosphere containing oxygen.

5. A method of producing a thin film transistor comprising the following steps between a gate electrode layer formation step and a channel formation step of forming a channel oxide (possibly containing inevitable impurities):
    an exposure step of exposing one surface of a first precursor layer, which is obtained from a first precursor solution as a start material including both a precursor containing lanthanum (La) and a precursor containing tantalum (Ta) as solutes, is exposed to a mixed vapor of a hydrochloric acid vapor and a nitric acid vapor and;
    a first oxide layer formation step of forming an oxide layer (possibly containing inevitable impurities) consisting of the lanthanum (La) and the tantalum (Ta) by heating the precursor layer in the atmosphere containing oxygen.

6. The method of producing a thin film transistor according to claim 5, wherein the mixed vapor is a vapor generated by boiling the hydrochloric acid and the nitric acid.

* * * * *